United States Patent
Briere (10) Patent No.: US 9,349,715 B2
(45) Date of Patent: May 24, 2016

(54) DEPLETION MODE GROUP III-V TRANSISTOR WITH HIGH VOLTAGE GROUP IV ENABLE SWITCH

(71) Applicant: International Rectifier Corporation, El Segundo, CA (US)

(72) Inventor: Michael A. Briere, Scottsdale, AZ (US)

(73) Assignee: Infineon Technologies Americas Corp., El Segundo, CA (US)

(*) Notice: Subject to any disclaimer, the term of this patent is extended or adjusted under 35 U.S.C. 154(b) by 38 days.

(21) Appl. No.: 14/302,271

(22) Filed: Jun. 11, 2014

(65) Prior Publication Data
US 2014/0375242 A1    Dec. 25, 2014

Related U.S. Application Data
(60) Provisional application No. 61/837,777, filed on Jun. 21, 2013.

(51) Int. Cl.
| | | |
|---|---|---|
| H02P 27/04 | (2006.01) | |
| H01L 27/02 | (2006.01) | |
| H02M 7/5387 | (2007.01) | |
| H03K 17/22 | (2006.01) | |
| H02P 25/16 | (2006.01) | |
| H02M 1/32 | (2007.01) | |
| H02M 1/36 | (2007.01) | |
| H02M 5/297 | (2006.01) | |
| H03K 17/06 | (2006.01) | |

(52) U.S. Cl.
CPC ............ *H01L 27/0207* (2013.01); *H02M 1/32* (2013.01); *H02M 1/36* (2013.01); *H02M 5/297* (2013.01); *H02M 7/5387* (2013.01); *H02P 25/16* (2013.01); *H03K 17/223* (2013.01); *H03K 2017/066* (2013.01); *H03K 2217/0063* (2013.01); *H03K 2217/0072* (2013.01)

(58) Field of Classification Search
CPC . H02M 7/5387; H02M 1/096; Y02B 70/1491
See application file for complete search history.

(56) References Cited

U.S. PATENT DOCUMENTS
| | | | |
|---|---|---|---|
| 8,674,670 | B2 | 3/2014 | Briere |
| 2008/0122418 | A1 | 5/2008 | Briere |

(Continued)

FOREIGN PATENT DOCUMENTS
| | | |
|---|---|---|
| EP | 2 237 402 | 10/2010 |
| JP | 2013/070530 | 4/2013 |
| JP | 2010/220303 | 9/2013 |

OTHER PUBLICATIONS
U.S. Appl. No. 61/837,777, filed Jun. 21, 2013, Briere.

*Primary Examiner* — Karen Masih
(74) *Attorney, Agent, or Firm* — Farjami & Farjami LLP (57) ABSTRACT

There are disclosed herein various implementations of a half-bridge or multiple half-bridge switch configurations used in a voltage converter circuit using at least two normally ON switches. Such a circuit includes a high side switch and a low side switch coupled between a high voltage rail and a low voltage rail of the voltage converter circuit. The high side switch is coupled to the low side switch at a switch node of the voltage converter circuit. At least one group IV enhancement mode switch is used as an enable switch. The group IV enhancement mode enable switch may be an insulated gate bipolar transistor (IGBT), a super junction field-effect transistor (SJFET), a unipolar group IV field-effect transistor (FET), or a bipolar junction transistor (BJT).

20 Claims, 5 Drawing Sheets

(56) References Cited

U.S. PATENT DOCUMENTS

| | | | |
|---|---|---|---|
| 2009/0135636 A1* | 5/2009 | Kuzumaki | H02M 1/096 363/132 |
| 2011/0080156 A1 | 4/2011 | Briere | |
| 2011/0254018 A1 | 10/2011 | Domes | |
| 2013/0049654 A1 | 2/2013 | Kure | |
| 2014/0070786 A1* | 3/2014 | Guerra | G05F 1/618 323/285 |

* cited by examiner

DEPLETION MODE GROUP III-V TRANSISTOR WITH HIGH VOLTAGE GROUP IV ENABLE SWITCH

The present application claims the benefit of and priority to a provisional application entitled "Depletion Mode Group III-V Device with DC Enable IGBT Switch," Ser. No. 61/837,777 filed on Jun. 21, 2013. The disclosure in this provisional application is hereby incorporated fully by reference into the present application.

BACKGROUND

I. Definition

As used herein, "III-Nitride" or "III-N" refers to a compound semiconductor that includes nitrogen and at least one group III element such as aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), aluminum indium gallium arsenide phosphide nitride ($Al_xIn_yGa_{(1-x-y)}As_aP_bN_{(1-a-b)}$), for example. III-N also refers generally to any polarity including but not limited to Ga-polar, N-polar, semi-polar, or non-polar crystal orientations. A III-N material may also include either the Wurtzitic, Zincblende, or mixed polytypes, and may include single-crystal, monocrystalline, polycrystalline, or amorphous structures. Gallium nitride or GaN, as used herein, refers to a III-N compound semiconductor wherein the group III element or elements include some or a substantial amount of gallium, but may also include other group III elements in addition to gallium. A III-N or a GaN transistor may also refer to a composite high voltage enhancement mode transistor that is formed by connecting the III-N or the GaN transistor in cascade with a lower voltage group IV transistor.

In addition, as used herein, the phrase "group IV" refers to a semiconductor that includes at least one group IV element such as silicon (Si), germanium (Ge), and carbon (C), and may also include compound semiconductors such as silicon germanium (SiGe) and silicon carbide (SiC), for example. Group IV also refers to semiconductor materials which include more than one layer of group IV elements, or doping of group IV elements to produce strained group IV materials, and may also include group IV based composite substrates such as silicon on insulator (SOI), separation by implantation of oxygen (SIMOX) process substrates, and silicon on sapphire (SOS), for example.

It is noted that, as used herein, the terms "low voltage" or "LV" in reference to a transistor or switch describes a transistor or switch with a voltage range of up to approximately fifty volts (50V). It is further noted that use of the term "midvoltage" or "MV" refers to a voltage range from approximately fifty volts to approximately two hundred volts (approximately 50V to 200V). Moreover, the term "high voltage" or "HV," as used herein, refers to a voltage range from approximately two hundred volts to approximately twelve hundred volts (approximately 200V to 1200V), or higher.

In the present application, "normally ON," "depletion mode," "D-mode," or "d-mode" may be used interchangeably when referring to depletion mode transistors. Conversely, "normally OFF," "enhancement mode," "E-mode," or "e-mode" may be used interchangeably when referring to enhancement mode transistors.

II. Background Art

In high power and high performance circuit applications, group III-V field-effect transistors (FETs), such as gallium nitride (GaN) or other III-Nitride based high mobility electron transistors (HEMTs), are often desirable for their high efficiency and high-voltage operation. III-Nitride and other group III-V HEMTs operate using polarization fields to generate a two-dimensional electron gas (2DEG) allowing for high current densities with low resistive losses. Because the 2DEG can arise naturally at a heterojunction interface of the III-Nitride or other group III-V materials forming the HEMT, group III-V HEMTs typically conduct without the application of a gate potential. That is to say, III-Nitride and other group III-V HEMTs tend to be native depletion mode (i.e., normally ON) devices.

Although their high breakdown voltage, high current density, and low on-resistance render III-Nitride HEMTs potentially advantageous for use in power applications, the normally ON nature of III-Nitride HEMTs can give rise to problems when such depletion mode transistors are used as power switches. For example, there is a possibility of damaging the load and circuit if the circuit powers up (i.e., bias is applied to the switch terminals) prior to biasing the gate of at least one of the depletion mode III-Nitride HEMTs to hold it in the high resistive or off-state (OFF). However, the use of depletion mode transistors enables simplified monolithic integration of multiple HEMTs. Integration is particularly important when the required devices become relatively small (e.g., less than approximately 2.0 mm$^2$), as it is often easier and less expensive to monolithically integrate smaller III-Nitride devices then it would be to singulate and package very small discrete III-Nitride devices.

SUMMARY

The present disclosure is directed to the use of depletion mode group III-V transistors with a high voltage group IV enable switch, substantially as shown in and/or described in connection with at least one of the figures, and as set forth more completely in the claims.

DETAILED DESCRIPTION

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Power conversion circuits come in several switch configurations for use in various power management applications. Typically, silicon based metal-oxide-semiconductor field-effect transistor (MOSFET), insulated gate bipolar transistor (IGBT), and super-junction field-effect transistor (SJET) technologies have been used in these circuits. However, more recently, group III-V semiconductor transistor technology, such as III-Nitride high electron mobility transistor (HEMT) technology, is being developed as an alternative to these silicon based transistor devices.

As stated above, III-Nitride and other group III-V HEMTs operate using polarization fields to generate a two-dimensional electron gas (2DEG) allowing for high current densities with low resistive losses. Because the 2DEG can arise naturally at a heterojunction interface of the III-Nitride or other group III-V materials forming the HEMT, group III-V HEMTS typically conduct without the application of a gate potential. That is to say, III-Nitride and other group HEMTs tend to be native depletion mode (i.e., normally ON) devices.

Although their high breakdown voltage, high current density, and low on-resistance render group III-V HEMTs potentially advantageous for use in power applications, the normally ON nature of group III-V HEMTs can give rise to problems when such depletion mode transistors are used as power switches. For example, there is a possibility of damaging the load and circuit if the circuit powers up (i.e., bias is applied to the switch terminals) prior to biasing the gate of at least one of the depletion mode III-Nitride HEMT to hold it in the high resistive or off-state (OFF).

However, the use of depletion mode transistors enables simplified monolithic integration of multiple HEMTs. Integration is particularly important when the required devices become relatively small (e.g., less than approximately 2.0 mm$^2$), as it is often easier and less expensive to monolithically integrate smaller III-Nitride devices then it would be to singulate and package very small discrete III-Nitride devices.

The present application is directed to voltage conversion circuits including one or more normally ON III-Nitride or other group III-V switches and a group IV enhancement mode (normally OFF) switch. The group IV enhancement mode switch is implemented as an enable switch in the conduction path between the voltage supply and the normally ON group III-V switch, in order to make or break the conduction path to or from the normally ON group III-V switch.

In half-bridge circuit configurations there are typically two switches connected in series across the voltage supply rails. In the case where native depletion mode devices (e.g., III-Nitride HEMTs) are used as the high and low side switches, there is a potential to short across the positive and negative rails. Although the use of a composite switch including a low voltage (LV) enhancement mode switch and a high voltage (HV) normally ON switch could be used to form a normally OFF switch, such a device configuration may not lend itself well to integration, particularly when very small devices are needed for relatively low load currents.

Robust, stable enhancement mode III-Nitride devices presently suffer from relatively poor performance, and, consequently, depletion mode III-Nitride devices are preferred in some implementations. Therefore, to prevent shorting across the positive and negative voltage rails when normally ON III-Nitride switches are used, an enable switch is kept in the off-state until the normally ON III-Nitride switches are controlled. That is to say, at least one normally ON III-Nitride switch may be held OFF by supplying a negative bias to the gate of the normally ON III-Nitride switch until the system controller determines that the system is safe (e.g., no short or other undesirable condition exists at the load).

It is noted that related circuit configurations design for LV power conversion circuits and depletion mode III-Nitride HEMTs using a silicon MOSFET based enable switch or protection circuit are disclosed in U.S. Pat. No. 7,902,809, entitled "DC/DC Converter Including a Depletion Mode Power Switch", and issued on Mar. 8, 2011, and U.S. Pat. No. 8,674,670, entitled "DC/DC Converter with Depletion-Mode III-Nitride Switches", and issued on Mar. 18, 2014. The entire disclosures in these patents are hereby incorporated fully by reference into the present application.

However, it is further noted that, although LV and midvoltage (MV) unipolar silicon based FETs may be appropriate for providing the enable switch functionality in LV and MV circuits, their use may be less suitable in HV circuits. IGBTs and SJFETs are typically better suited for use as enable switches in HV circuits, due to their significantly better effective on-resistance for a given die size and cost.

Unlike the III-Nitride switches implemented as high side and low side switches in a voltage converter circuit, which may need to switch at higher frequencies based on the application, the group IV enhancement mode enable switch (e.g., IGBT or SJFET) only needs to switch occasionally during circuit power up conditions or other system fault conditions. As such, the switch charge of the group IV enable switch is not as critical and therefore can be optimally designed to exhibit a higher charge for the application current and result in a lower cost device.

Figure 1:
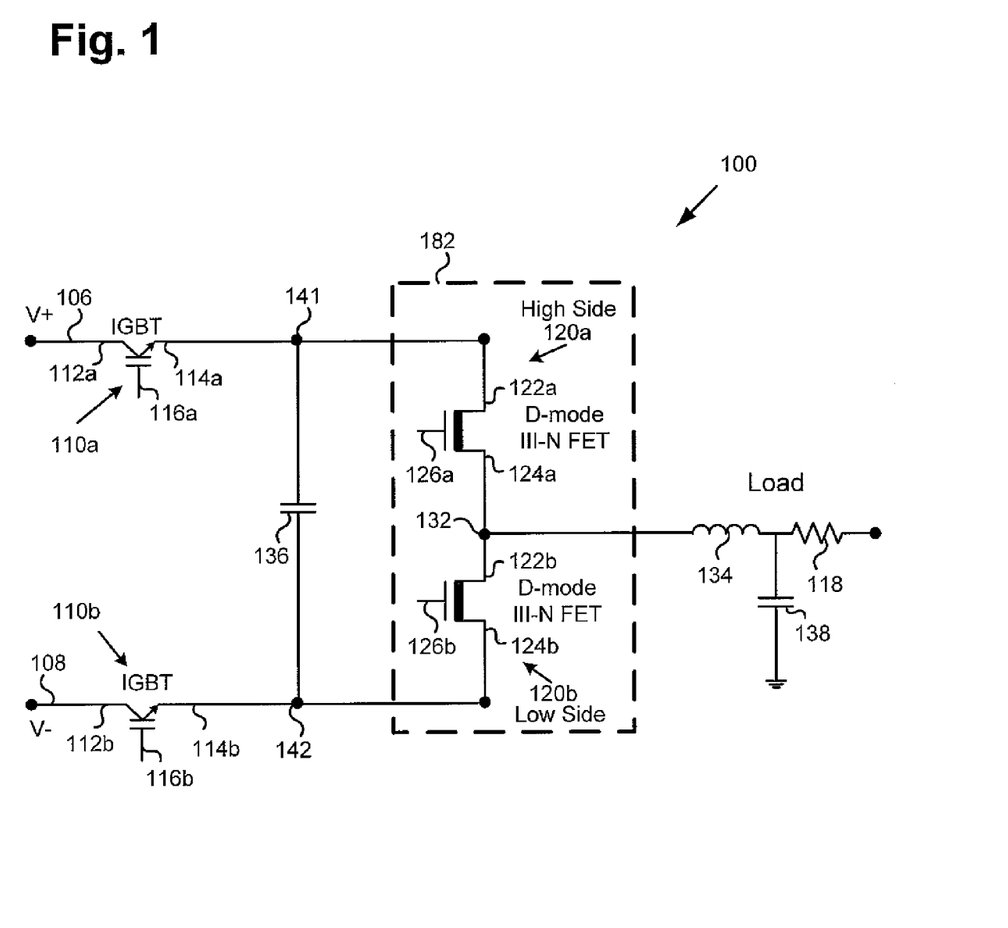
FIG. 1 shows an exemplary half-bridge voltage converter circuit including high side and low side normally ON III-Nitride transistors, and two IGBT enable switches, according to one implementation.

FIG. 1 is an example of utilizing a switch circuit including a combination of at least two normally ON III-Nitride FETs together with a group IV enhancement mode enable switch. FIG. 1 shows exemplary voltage converter circuit 100 implemented as a half-bridge switching circuit including a high switch and a low side switch, according to one implementation. Voltage converter circuit 100, which may be a buck converter, for example, includes switching branch 182 having high side switch 120a coupled to low side switch 120b at switch node 132. Alternatively, a boost circuit could be appropriately configured.

As shown in FIG. 1, high side switch 120a and low side switch 120b of switching branch 182 are coupled between high voltage rail 106 and low voltage rail 108 of voltage converter circuit 100. As further shown in FIG. 1, high side switch 120a and low side switch 120b are implemented as respective normally ON III-Nitride FETs (hereinafter "D-mode III-Nitride FET 120a" and "D-mode III-Nitride FET 120b"). It is noted that, as used in the present application, the expressions "depletion mode", "D-mode", and "normally ON" can be used interchangeably. Also shown in FIG. 1 are load 118 coupled to switch node 132 through output inductor 134, and capacitor 138.

Load 118 may either be predominantly one of, or a combination of, inductance, resistance, and capacitance.

FIG. 1 provides an example of utilizing symmetric power rails with an IGBT as an enhancement mode enable switch on both rails for switching branch 182. That is to say, IGBT enable switch 110a is coupled between input voltage V+ at high voltage rail 106 and high side switch 120a, and IGBT enable switch 110b is coupled between input voltage V− at low voltage rail 108 and low side switch 120b. As such, emitter 114a of IGBT enable switch 110a may be coupled to drain 122a of D-mode III-Nitride FET 120a, and drain 122b of D-mode III-Nitride FET 120b may be coupled to switch node 132. Moreover, emitter 114b of IGBT enable switch 110b may be coupled to source 124b of D-mode III-Nitride FET 120b. It is noted that FIG. 1 also shows collector 112a and gate 116a of IGBT enable switch 110a, collector 112b and gate 116b of IGBT enable switch 110b, source 124a and gate 126a of D-mode III-Nitride FET 120a, and gate 126b of D-mode III-Nitride FET 120b.

In certain implementations, voltage converter circuit 100 may be configured as a boost converter, a buck converter, a motor drive or as other common voltage converter circuit configurations. Additionally, in certain other implementations, the enhancement mode enable switch(es) represented by IGBTs 110a and 110b may be implemented as an SJET or using another HV group IV based technology.

Continuing to refer to FIG. 1, optional capacitor 136 is shown coupled between high voltage rail 106 and low voltage rail 108 at nodes 141 and 142. Optional capacitor 136 may be used to reduce the current rating requirement of the group IV enhancement mode enable switches (e.g., IGBT enable switches 110a and 110b). D-mode III-Nitride FET 120a serves as the control switch of half-bridge switching branch 182, and is thus typically ON with a given duty cycle "D", supplying current from high voltage rail 106 to load 118. Unlike D-mode III-Nitride FET 120a, which has a higher frequency switching cycle, IGBT enable switch 110a need not switch at high frequency, as discussed above. Therefore, by coupling optional capacitor 136 between high and low voltage rails 106 and 108, improved transient response can be provided to D-mode III-Nitride switches 120a and 120b. Consequently, the overall ohmic losses through IGBT enable switches 110a and 110b are less, leading to the potential use of a smaller (and less expensive) IGBT or other group IV enable switch.

Figure 2:
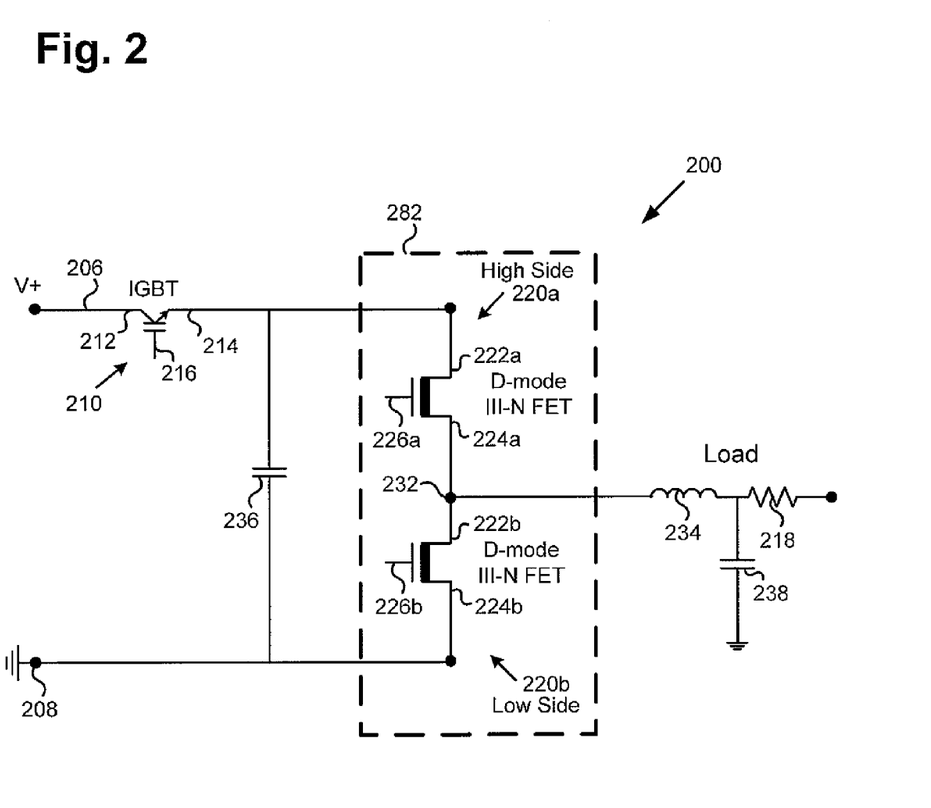
FIG. 2 shows an exemplary half-bridge voltage converter circuit including high side and low side normally ON III-Nitride transistors, and an IGBT enable switch, according to another implementation.

FIG. 2 is another example of utilizing a switch circuit including a combination of at least two D-mode III-Nitride FETs together with a group IV enhancement mode enable switch. FIG. 2 shows exemplary voltage converter circuit 200 implemented as a half-bridge switching circuit with asymmetric power rails including a high side switch and a low side switch, according to one implementation. Voltage converter circuit 200 includes switching branch 282 having high side switch 220a coupled to low side switch 220b at switch node 232. As shown in FIG. 2, high side switch 220a and low side switch 220b of switching branch 282 (hereinafter "D-mode III-Nitride FET 220a" and "D-mode III-Nitride FET 220b", respectively) are coupled between high voltage rail 206 and grounded rail 208 of voltage converter circuit 200. Also shown in FIG. 2 are load 218 coupled to switch node 232 through output inductor 234, and capacitor 238. Load 218 may either be predominantly one of or a combination of, inductance, resistance, and capacitance.

FIG. 2 provides an example of utilizing asymmetric power rails with an IGBT as an enable switch on high voltage rail 206 for switching branch 282. That is to say, IGBT enable switch 210 is coupled in series between input voltage V+ at high voltage rail 206 and D-mode III-Nitride FET 220a. As such, emitter 214 of IGBT enable switch 210 may be coupled to drain 222a of D-mode III-Nitride FET 220a, and drain 222b of D-mode III-Nitride FET 220b may be coupled to switch node 232. It is noted that in certain other implementations, the enable switch may take the form of a SJET or other HV silicon-based switch.

Also shown in FIG. 2 are collector 212 and gate 216 of IGBT enable switch 210, and gate 226a of D-mode III-Nitride FET 220a, as well as drain 222b, source 224b, and gate 226b of D-mode III-Nitride FET 220b. In addition, FIG. 2 shows optional capacitor 236 coupled between the high voltage rail 206 and grounded rail 208. Optional capacitor 236, if used, serves the same function as optional capacitor 136 described in FIG. 1 and may share any of the characteristics attributed to optional capacitor 136.

Figure 3:
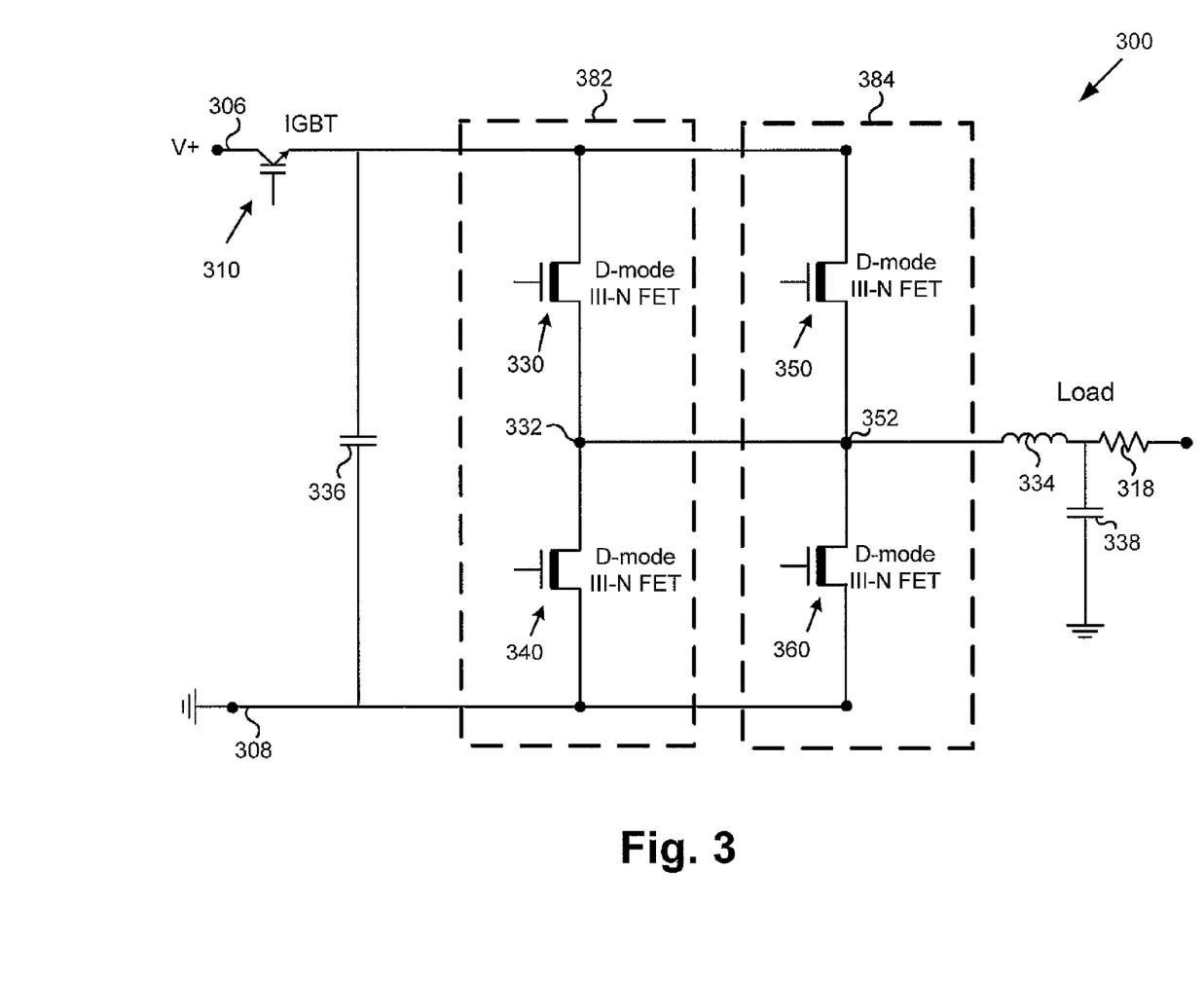
FIG. 3 shows an exemplary full-bridge voltage converter circuit including high side and low side normally ON III-Nitride transistors, and an IGBT enable switch, according to one implementation.

Continuing to FIG. 3, FIG. 3 is yet another example of utilizing a switch circuit including a combination of at least two D-mode III-Nitride FETs together with a group IV enhancement mode enable switch. FIG. 3 shows exemplary voltage converter circuit 300 implemented as an H-bridge, or full-bridge, switching circuit including first and second switching branches, according to one implementation. Voltage converter circuit 300 includes switching branch 382 having high side switch 330 coupled to low side switch 340 at switch node 332, and switching branch 384 having high side switch 350 coupled to low side switch 360 at switch node 352.

As shown in FIG. 3, switching branches 382 and 384 are each coupled between high voltage rail 306 and grounded rail 308 of voltage converter circuit 300. Also shown in FIG. 3 are load 318 coupled to switch node 352 through output inductor 334, and capacitor 338. Load 318 may either be predominantly one of, or a combination of, inductance, resistance, and capacitance. Also shown in FIG. 3 is optional capacitor 336 coupled between the high voltage rail 306 and grounded rail 308. Optional capacitor 336, if used, serves the same function as optional capacitor 136 described in FIG. 1 and may share any of the characteristics attributed to optional capacitor 136.

FIG. 3 also shows IGBT enable switch 310 coupled to D-mode III-Nitride high side switches 330 and 350. That is to say, IGBT switch 310 is coupled between high input voltage V+ at high voltage rail 306 and high side D mode III-Nitride FETs 330 and 350 of switching branches 382 and 384, respectively. Switching branch 382 including high side switch 330 and low side switch 340, and switching branch 384 including high side switch 350 and low side switch 360 each corresponds to switching branch 282 including high side switch 220a and low side switch 220b, in FIG. 2, and may share any of the characteristics attributed to those corresponding features above.

It is also noted that in certain other implementations, enhancement mode enable switch 310 may take the form of a SJFET or other HV silicon-based switch. It is further noted that a symmetric power rail configuration similar to that shown in FIG. 1 may be used in a full bridge configuration. In such a case, as in the case shown in FIG. 1, an enhancement mode enable switch, such as a group IV IGBT or SJFET may be used with the negative, low voltage rail, as well as with the positive, high voltage rail, by analogy to the example shown in FIG. 1.

Figure 4:
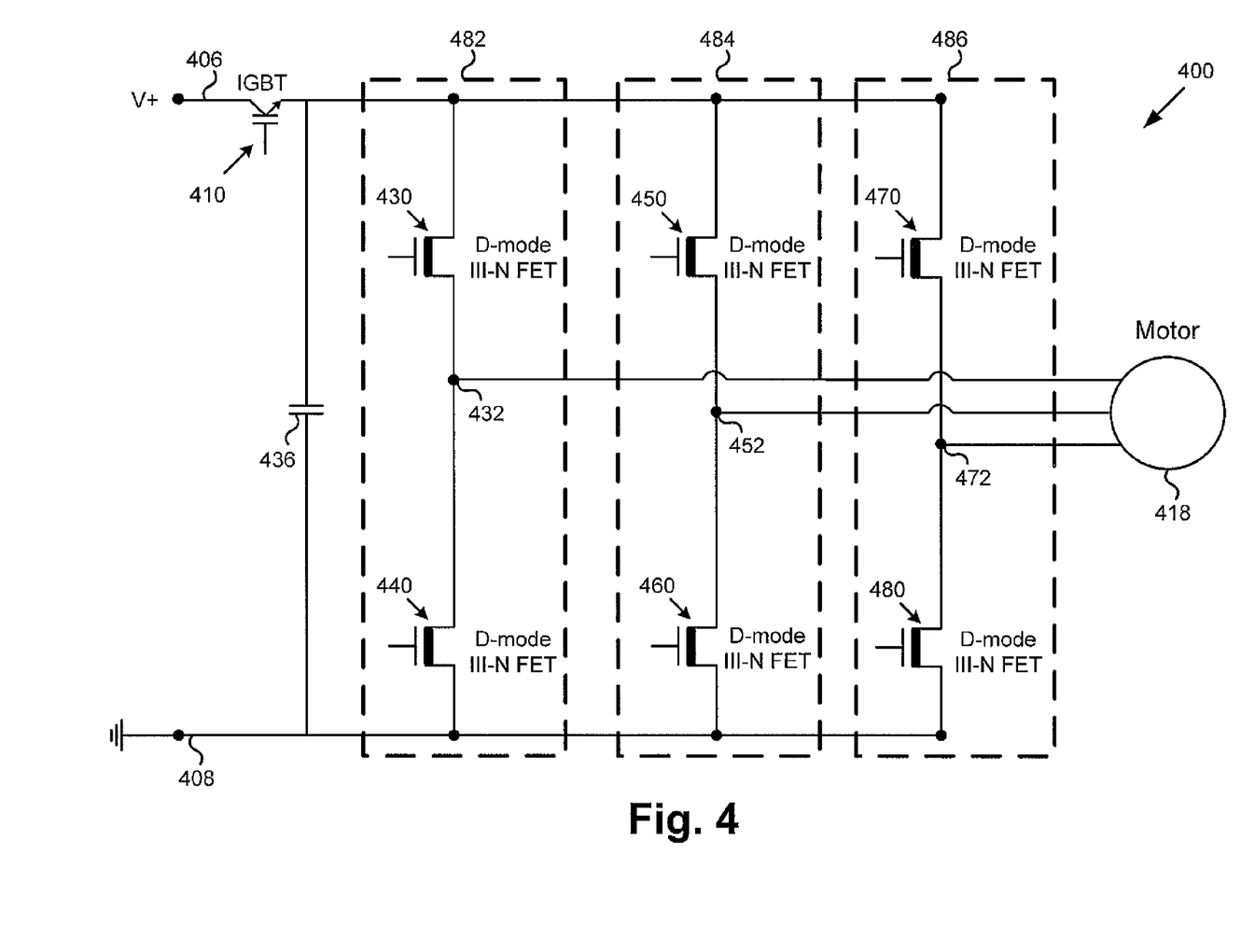
FIG. 4 shows an exemplary voltage converter circuit for driving a three phase motor and including normally ON III-Nitride transistors and an IGBT enable switch, according to one implementation.

FIG. 4 is another example of utilizing a switch circuit including a combination of at least two D-mode III-Nitride FETs together with a group IV enhancement mode enable switch. FIG. 4 shows exemplary voltage converter 400 for driving three phase motor 418, or more generally a three phase load. As shown in FIG. 4, voltage converter circuit 400, includes high side switches 430, 450, and 470, and low side switches 440, 460, and 480. As further shown in FIG. 4, high side switch 430 and low side switch 440 are coupled between high voltage rail 406 and grounded rail 408 to provide switching branch 482. Similarly, high side switches 450/470 and respective low side switches 460/480 are coupled between high voltage rail 406 and grounded rail 408 to provide respective switching branches 484/486. Also shown in FIG. 4 are switch nodes 432, 452, and 472 of respective switching branches 482, 484, and 486, coupled to three phase motor 418, as well as optional capacitor 436, and IGBT enable switch 410.

IGBT enable switch 410 is coupled between input voltage V+ at high voltage rail 406 and D-mode III-Nitride FET high side switches 430/450/470. Switching branch 482 including high side switch 430 and low side switch 440, switching branch 484 including high side switch 450 and low side switch 460, and switching branch 486 including high side switch 470 and low side switch 480 each corresponds to switching branch 282 including high side switch 220a and low side switch 220b, in FIG. 2, and may share any of the characteristics attributed to those corresponding features above. Optional capacitor 436 is coupled between the high voltage rail 406 and grounded rail 408. Optional capacitor 436, if used, serves the same function as optional capacitor 136 described in FIG. 1 and may share any of the characteristics attributed to optional capacitor 136.

It is also noted that in certain other implementations, the enable switch 410 may take the form of a SJFET or other HV Group IV based switch. It is further noted that a symmetric power rail configuration similar to that shown in FIG. 1 may be used in a variation of the present circuit configuration. In such a case, as in the case shown in FIG. 1, an enhancement mode enable switch, such as a group IV IGBT, or an SJFET or unipolar FET may be used with the negative, low voltage rail, as well as with the positive, high voltage rail, by analogy to the example shown in FIG. 1.

Figure 5:
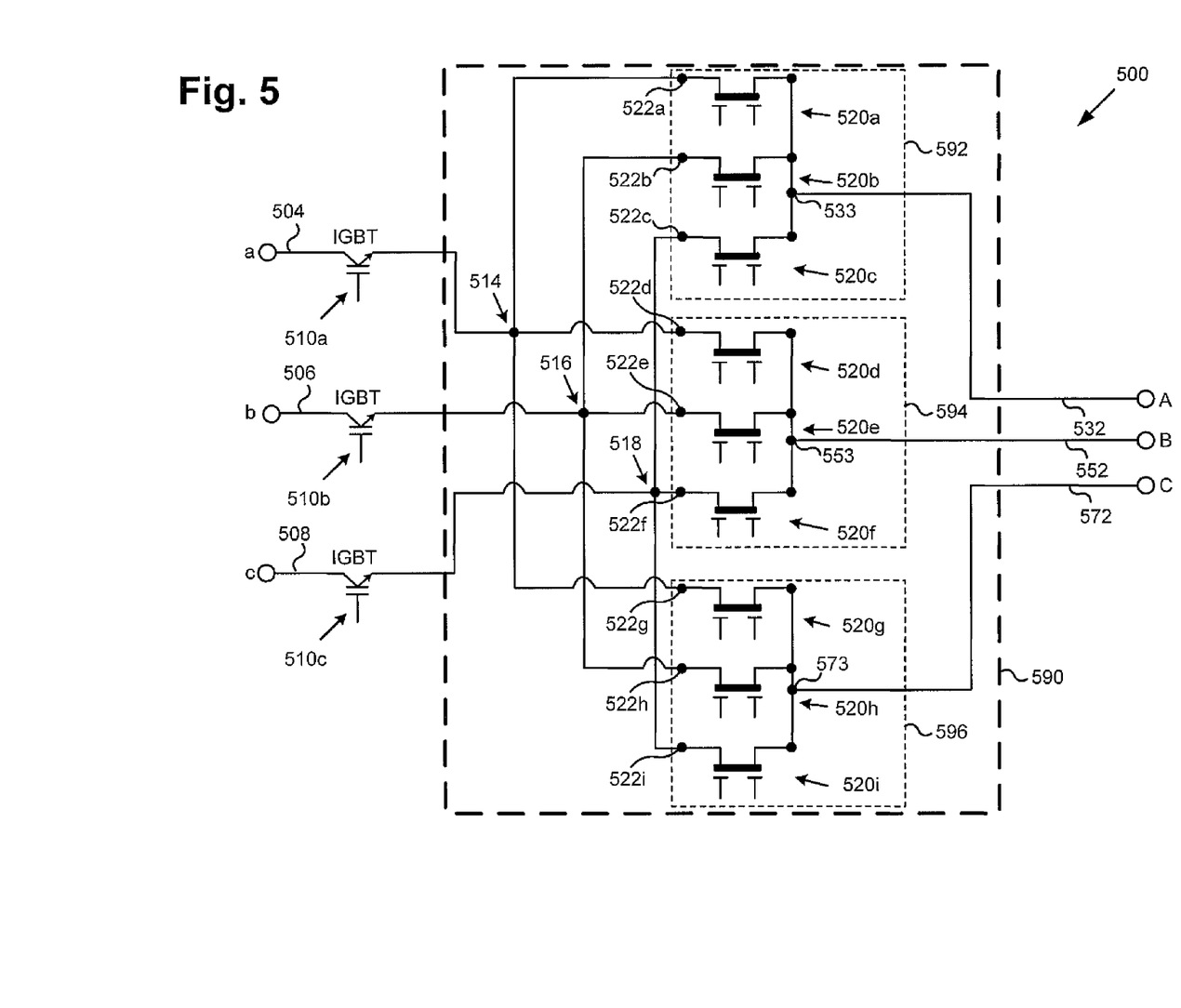
FIG. 5 shows an exemplary three phase matrix converter circuit including normally ON group III-V bi-directional switches and IGBT enable switches, according to one implementation.

Referring to FIG. 5, FIG. 5 shows exemplary three phase to three phase matrix converter circuit 500 including nine bi-directional switches that allow any output phase to be coupled to any input phase. As shown in FIG. 5, matrix converter circuit 500 includes switch matrix 590 having three switch branches 592, 594, and 596, and including nine bi-directional depletion mode III-Nitride matrix switches 520a, 520b, 520c, 520d, 520e, 520f, 520g, 520h, and 520i (hereinafter "normally ON III-Nitride matrix switches 520a-520i"). First switch branch 592 includes first set of switches 520a, 520b, and 520C. Second switch branch 594 includes second set of switches 520d, 520e, and 520f. Third switch branch 596 includes third set of switches 520g, 520h, and 520i.

The outputs of first switch branch 592 bi-directional matrix switches 520a, 520b, and 520c are coupled through output node 533 to output phase 532. Similarly, the outputs of second switch branch 594 bi-directional matrix switches 520d, 520e, and 520f are coupled through output node 553 to output phase 552, and the outputs of third switch branch 594 bi-directional switches 520g, 520h, and 520i are coupled through output node 573 to output phase 572.

Although, according to the exemplary implementation shown in FIG. 5, normally ON III-Nitride matrix switches 520a-520i are implemented as dual-gate III-Nitride FETs, in other implementations, normally ON III-Nitride matrix switches 520a-520i may be implemented as single-gate normally ON III-Nitride or other group III-V FETs.

As further shown in FIG. 5, bi-directional matrix switches 520a, 520d, and 520g have respective inputs 522a, 522d, and 522g coupled to IGBT enable switch 510a through input node 514. Similarly, bi-directional matrix switches. 520b, 520e, and 520h have respective inputs 522b, 522e, and 522h coupled to IGBT enable switch 510b through input node 516, while bi-directional matrix switches 520c, 520f, and 520i have respective inputs 522c, 522f, and 522i, coupled to IGBT enable switch 510c through input node 518.

FIG. 5 provides yet another example of utilizing a switch circuit including more than two D-mode III-Nitride switches together with group IV enhancement mode enable switches. That is to say, IGBT enable switch 510a is coupled in series between phase input 504 and switch node 514, which is coupled to D-mode III-Nitride matrix switches 520a/520d/520g. Similarly, IGBT enable switch 510b is coupled in series between phase input 506 and switch node 516, which is coupled to D-mode III-Nitride matrix switches 520b/520e/520h, and IGBT enable switch 510c is coupled in series between phase input 508 and switch node 518, which is coupled to D-mode III-Nitride matrix switches 520c/520f/520i.

It is noted that the matrix converter circuit shown in FIG. 5 may also include other protective elements not shown in the interests of conceptual clarity. For example, matrix converter circuit 500 may include input filters (e.g., L-C circuits), clamp circuits, diodes, and varistors, among other features. It is further noted that as an alternative design, the group IV enhancement mode enable switches 510a, 510b, and 510c, which may be implemented as IGBTs, or SJFETs, or other group IV devices, may be coupled between the III-Nitride D-mode switch output nodes 533/553/573 and respective output phases 532/552/572. It is reiterated that the three phase to three phase matrix converter circuit shown in FIG. 5 is merely an example of many possible matrix converter configurations.

Thus, the present application discloses various implementations of voltage converter circuits including one or more normally ON III-Nitride or other group III-V switches, and a group IV enhancement mode enable switch. The group IV enhancement mode enable switch is implemented in the conduction path of at least one of the normally ON group III-V switches, in order to make or break the conduction path to or from the normally ON group III-V switch and a voltage rail. As a result, the voltage converter solutions disclosed herein can prevent damage to a load driven by the voltage converter due to premature power-up of the voltage converter circuitry prior to biasing of at least one of the normally ON group III-V switches to hold it in the high resistance or off-state (OFF). Moreover, in the event of a circuit fault, the group IV enhancement mode enable switch may be used to disconnect the normally ON group III-V switch or switches from a voltage supply rail of the voltage converter to provide protection for the normally ON group III-V switch and the load.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the spirit and the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:
1. A circuit comprising:
  at least one half-bridge which includes a normally ON high side switch and a normally ON low side switch coupled between a high voltage rail and a low voltage rail of said circuit;
  said normally ON high side switch coupled to said normally ON low side switch at a switch node of said half-bridge;
  at least said normally ON high side switch being a normally ON III-Nitride switch; and a group IV enhancement mode transistor coupled between said normally ON high side switch and said high voltage rail, said group IV enhancement mode transistor configured as an enable switch for said normally ON III-Nitride switch.

2. The circuit of claim 1, wherein said circuit is configured as a buck converter.

3. The circuit of claim 1, wherein said group IV enhancement mode transistor comprises an insulated gate bipolar transistor (IGBT).

4. The circuit of claim 1, wherein said group IV enhancement mode transistor comprises a super-junction field-effect transistor (SJFET).

5. The circuit of claim 1, wherein said group IV enhancement mode transistor comprises a unipolar field-effect transistor (FET).

6. The circuit of claim 1, wherein said circuit includes more than one group IV enhancement mode transistor.

7. The circuit of claim 1, wherein said normally ON III-Nitride switch comprises a III-Nitride FET.

8. The circuit of claim 1, wherein said normally ON III-Nitride switch comprises a III-Nitride high electron mobility transistor (HEMT).

9. A circuit for driving a three phase motor, said circuit comprising:
    a first switching branch including a first normally ON high side switch and a first normally ON low side switch coupled between high and low voltage rails of said circuit;
    a second switching branch including a second normally ON high side switch and a second normally ON low side switch coupled between said high and low voltage rails;
    a third switching branch including a third normally ON high side switch and a third normally ON low side switch coupled between said high and low voltage rails;
    at least one of said first, second, and third high side normally ON switches being a normally ON group III-V switch; and
    at least one group IV enhancement mode transistor coupled between said normally ON group III-V switch and said high voltage rail, said group IV enhancement mode transistor configured as an enable switch for at least one of said first, second, and third switching branches.

10. The circuit of claim 9, wherein said group IV enhancement mode transistor comprises an insulated gate bipolar transistor (IGBT).

11. The circuit of claim 9, wherein said group IV enhancement mode transistor comprises a super-junction field-effect transistor (SJFET).

12. The circuit of claim 9, wherein said group IV enhancement mode transistor comprises a unipolar field-effect transistor (FET).

13. The circuit of claim 9, wherein said circuit includes more than one group IV enhancement mode transistor.

14. The circuit of claim 9, wherein said normally ON group III-V switch comprises a III-Nitride FET.

15. The circuit of claim 9, wherein said normally ON group III-V switch comprises a III-Nitride high electron mobility transistor (HEMT).

16. A matrix converter circuit for driving a three phase load, said matrix converter circuit comprising:
    a first switching branch including a first set of three normally ON bi-directional switches coupled to a first output node of said matrix converter circuit;
    a second switching branch including a second set of three normally ON bi-directional switches coupled to a second output node of said matrix converter circuit; and
    a third switching branch including a third set of three normally ON bi-directional switches coupled to a third output node of said matrix converter circuit;
    at least one of said first, second, and third sets of normally ON bi-directional switches comprising a normally ON group III-V switch;
    at least one group IV enhancement mode transistor configured as an enable switch for said at least one normally ON group III-V switch.

17. The matrix converter circuit of claim 16, wherein said at least one group IV enhancement mode transistor comprises an insulated gate bipolar transistor (IGBT).

18. The matrix converter circuit of claim 16, wherein said at least one group IV enhancement mode transistor comprises a super-junction field-effect transistor (SJFET).

19. The matrix converter circuit of claim 16, wherein said at least one group IV enhancement mode transistor comprises a unipolar field effect transistor (FET).

20. The matrix converter circuit of claim 16, wherein said matrix converter circuit includes more than one group IV enhancement mode transistor.

* * * * *